United States Patent
Xia et al.

(10) Patent No.: US 10,937,995 B2
(45) Date of Patent: Mar. 2, 2021

(54) OLED DISPLAY AND OLED DISPLAY DEVICE WITH PLURALITY OF LIGHT-ABSORBING BODIES IN PLANARIZATION LAYER

(71) Applicant: WUHAN CHINA STAR OPTOELECTRONICS SEMICONDUCTOR DISPLAY TECHNOLOGY CO., LTD., Hubei (CN)

(72) Inventors: Chongchong Xia, Hubei (CN); Wei Yu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 34 days.

(21) Appl. No.: 16/463,805

(22) PCT Filed: Jan. 4, 2019

(86) PCT No.: PCT/CN2019/070466
§ 371 (c)(1),
(2) Date: May 23, 2019

(87) PCT Pub. No.: WO2020/113755
PCT Pub. Date: Jun. 11, 2020

(65) Prior Publication Data
US 2020/0235345 A1    Jul. 23, 2020

(30) Foreign Application Priority Data
Dec. 3, 2018 (CN) .......................... 201811467495.3

(51) Int. Cl.
*H01L 29/08* (2006.01)
*H01L 31/0232* (2014.01)
(Continued)

(52) U.S. Cl.
CPC ...... *H01L 51/5284* (2013.01); *H01L 27/1248* (2013.01); *H01L 27/1251* (2013.01);
(Continued)

(58) Field of Classification Search
None
See application file for complete search history.

(56) References Cited

U.S. PATENT DOCUMENTS

2003/0067266 A1    4/2003    Kim et al.
2004/0183436 A1    9/2004    Ito
(Continued)

FOREIGN PATENT DOCUMENTS

| CN | 1413069 A | 4/2003 |
|---|---|---|
| CN | 104282719 A | 1/2015 |
| CN | 108091772 A | 5/2018 |

*Primary Examiner* — Alonzo Chambliss

(57) ABSTRACT

An organic light emitting diode (OLED) display panel and an OLED display device include a substrate, a thin film transistor array function layer disposed on the substrate; a planarization layer disposed on the thin film transistor array function layer; an anode electrode disposed on the planarization layer; and a pixel definition layer disposed on the anode electrode. The planarization layer and/or the pixel definition layer include a plurality of light-absorbing bodies used for absorbing incident light emitted from outside the OLED display panel. The light-absorbing bodies are doped in the planarization layer and/or the pixel definition layer.

17 Claims, 2 Drawing Sheets

(51) Int. Cl.
*H01L 51/40* (2006.01)
*H01L 51/52* (2006.01)
*H01L 27/32* (2006.01)
*H01L 27/12* (2006.01)
*H01L 29/417* (2006.01)

(52) U.S. Cl.
CPC ...... *H01L 27/3246* (2013.01); *H01L 27/3258* (2013.01); *H01L 27/3262* (2013.01); *H01L 29/41733* (2013.01); *H01L 2251/5369* (2013.01)

(56) References Cited

U.S. PATENT DOCUMENTS

| | | | |
|---|---|---|---|
| 2008/0093978 A1* | 4/2008 | Mori | B82Y 30/00 313/498 |
| 2012/0049215 A1* | 3/2012 | Yoon | H01L 27/3246 257/91 |
| 2013/0200780 A1* | 8/2013 | Lee | H01L 51/5262 313/504 |
| 2014/0008618 A1* | 1/2014 | Lim | H01L 27/3246 257/40 |
| 2015/0084017 A1* | 3/2015 | Dai | H01L 51/5268 257/40 |
| 2016/0197097 A1* | 7/2016 | Kim | H01L 27/3276 257/40 |
| 2019/0148675 A1 | 5/2019 | Kudo et al. | |

* cited by examiner

OLED DISPLAY AND OLED DISPLAY DEVICE WITH PLURALITY OF LIGHT-ABSORBING BODIES IN PLANARIZATION LAYER

FIELD OF INVENTION

The invention relates to a display technology and more particularly, to an organic light emitting diode (OLED) display panel and an OLED device.

BACKGROUND OF INVENTION

In organic light emitting diode (OLED) display panels, the OLED display panel includes a gate electrode metal layer and a source/drain electrode metal layer. During the using processes of OLED display panels, outer light emits downward through an organic light emitting layer. Outer light may be reflected from the gate electrode layer and source/drain metal layer and the reflected light may transmit through the light emitting layer. Therefore, the reflected light and light emitted from the organic light emitting layer co-exist, which can result in light interference between the reflected light and light emitted from the organic light-emitting layer. Thus, it also can result in lower visual interference and negative influence on the light-emitting performance of the OLED display panel.

SUMMARY OF INVENTION

The present invention provides an OLED display panel and OLED display device to solve issues occurred in conventional OLED display panels. For example, outward light reflected from the gate electrode metal layer and source/drain electrode metal layer result in interference with light emitted from the OLED emitting layer and bad light-emitting performance of OLED display panel.

An embodiment of the present invention provides an organic light emitting diode (OLED) display panel, including: a substrate; a thin film transistor array function layer disposed on the substrate; a planarization layer disposed on the thin film transistor array function layer; an anode electrode disposed on the planarization layer; and a pixel definition layer disposed on the anode electrode. The planarization layer and/or the pixel definition layer include a plurality of light-absorbing bodies used for absorbing an incident light emitted from outside the OLED display panel. The light-absorbing bodies are doped in the planarization layer and/or the pixel definition layer. A material of the light-absorbing bodies is one or at least two selected from a group consisting of carbon nanotube, nickel-iron alloy and benzothiophene chemicals; and when the planarization layer is doped with the light-absorbing bodies, a particle size of the light-absorbing bodies is less than a thickness of the planarization layer. When the pixel definition layer is doped with the light-absorbing bodies, the particle size of the light-absorbing bodies is less than a thickness of the pixel definition layer.

In OLED display panel of the present invention, when the planarization layer is doped with the light-absorbing bodies, the particle size of the light-absorbing bodies is less than or equal to one third thickness of the planarization layer.

In OLED display panel of the present invention, the light-absorbing bodies are distributed uniformly in the planarization layer and/or the pixel definition layer.

In OLED display panel of the present invention, when the planarization layer is doped with the light-absorbing bodies, a doping ratio of the light-absorbing bodies and the planarization layer is less than or equal to 35 to 100. When the pixel definition layer is doped with the light-absorbing bodies, a doping ratio of the light-absorbing bodies and the pixel definition layer is less than or equal to 35 to 100.

In OLED display panel of the present invention, the thin film transistor array function layer includes an active layer, a first insulating layer, a first gate metal layer, a second insulating layer, a second gate metal layer, an interlayer dielectric layer and a source/drain metal layer on the substrate in sequence.

Another embodiment of the present invention provides an organic light emitting diode (OLED) display device which includes an OLED display panel. The OLED display panel includes a substrate; a thin film transistor array function layer disposed on the substrate; a planarization layer disposed on the thin film transistor array function layer; an anode electrode disposed on the planarization layer, and a pixel definition layer disposed on the anode electrode. Further, the planarization layer and/or the pixel definition layer comprise a plurality of light-absorbing bodies used for absorbing an incident light emitted from outside the OLED display panel, the light-absorbing bodies doped in the planarization layer and/or the pixel definition layer.

In OLED display panel of the present invention, when the planarization layer is doped with the light-absorbing bodies, a particle size of the light-absorbing bodies is less than a thickness of the planarization layer. When the pixel definition layer is doped with the light-absorbing bodies, the particle size of the light-absorbing bodies is less than a thickness of the pixel definition layer.

In OLED display panel of the present invention, when the planarization layer is doped with the light-absorbing bodies, the particle size of the light-absorbing bodies is less than one third thickness of the planarization layer.

In OLED display panel of the present invention, the light-absorbing bodies are distributed uniformly in the planarization layer and/or the pixel definition layer.

In OLED display panel of the present invention, when the planarization layer is doped with the light-absorbing bodies, a doping ratio of the light-absorbing bodies and the planarization layer is less than or equal to 35 to 100. When the pixel definition layer is doped with the light-absorbing bodies, a doping ratio of the light-absorbing bodies and the pixel definition layer is less than or equal to 35 to 100.

In OLED display panel of the present invention, a material of the light-absorbing bodies is one or at least two selected from a group consisting of carbon nanotube, nickel-iron alloy and benzothiophene chemicals.

In OLED display panel of the present invention, the thin film transistor array function layer comprises an active layer, a first insulating layer, a first gate metal layer, a second insulating layer, a second gate metal layer, an interlayer dielectric layer and a source/drain metal layer on the substrate in sequence.

Comparing to conventional display panels, OLED display panel and OLED display device according to the present invention utilize the light-absorbing bodies doped in the planarization layer and/or the pixel definition layer to absorb incident light emitted from outside the OLED display panel and to eliminate outer light reflected from the array function layer inside the OLED display panel and also lower the influence on the light-emitting layer from the reflected light. Therefore, only very minimum light is reflected and it can solve the problems occurred from conventional display panels. For example, outer light is reflected from the gate electrode layer and source/drain metal layer and can result in light interference between the reflected light and light emitted from the organic light-emitting layer. Therefore, the present invention can result in clear image and better performance and lower visual interference with OLED panels can effectively solve those issues occurred from conventional display panels.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
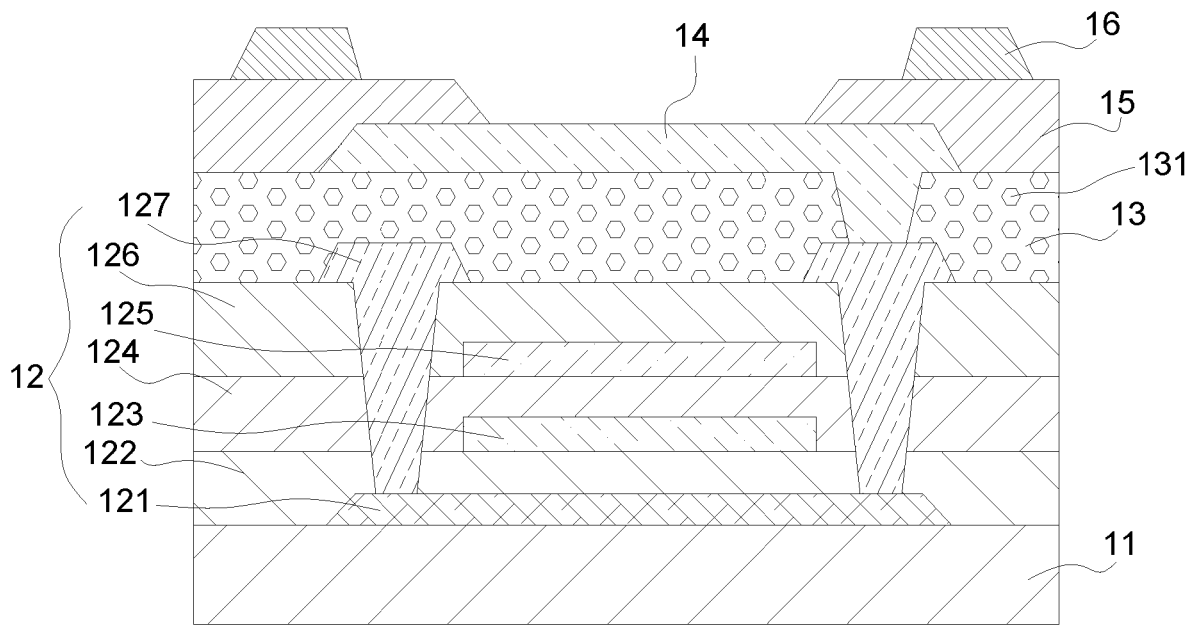
FIG. 1 is a schematic structural diagram of an organic light emitting diode (OLED) display panel according to a first embodiment of the present invention.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

An embodiment of the present invention provides an organic light emitting diode (OLED) display panel, including: a substrate; a thin film transistor array function layer disposed on the substrate; a planarization layer disposed on the thin film transistor array function layer; an anode electrode disposed on the planarization layer; and a pixel definition layer disposed on the anode electrode. The planarization layer and/or the pixel definition layer include a plurality of light-absorbing bodies used for absorbing an incident light emitted from outside the OLED display panel. The light-absorbing bodies are doped in the planarization layer (first embodiment) or the pixel definition layer (second embodiment) or doped both in the planarization layer (first embodiment) and the pixel definition layer (third embodiment).

Referring to FIG. 1, FIG. 1 is a schematic structural diagram of an OLED display panel according to a first embodiment of the present invention. The OLED display panel 100 of the first embodiment includes a substrate 11, a thin film transistor array function layer 12, a planarization layer 13, an anode electrode 14, a pixel definition layer 15, and a spacer 16.

The thin film transistor array function layer 12 is disposed on the substrate 11. The planarization layer 13 is disposed on the thin film transistor (TFT) array function layer 12. The anode electrode 14 is disposed on the planarization layer 13. The pixel definition layer 15 is disposed on the anode electrode 14. The spacer 16 is disposed on the pixel definition layer 15. The planarization layer 13 includes a plurality of light-absorbing bodies 131 used for absorbing incident light emitted from outside the OLED display panel. The light-absorbing bodies 131 are doped in the planarization layer.

In the first embodiment, when the outer light emits downward through the organic light emitting layer, light-absorbing bodies 131 doped in the planarization layer 13 absorbs most part of light and only little part of light can transmit to the first gate electrode metal layer 123 and the second gate electrode metal layer 125 or other layers in the TFT array function layer 12. Therefore, only very minimum light is reflected, which can result in clear image and better performance and lower visual interference in the OLED panels.

Regarding the forming processes of the planarization layer 13, at the beginning, prepare materials for the planarization layer. Material of the planarization layer 13 is a solution with high-concentration. Then, mix up the light-absorbing bodies 131 in the material of the planarization layer 13 and mix it in a uniform way. Then, coat the mixed solution on the TFT array function layer 12. Finally, dry the mixed solution to form the planarization layer 13.

For making sure the planarization layer 13 with good planarization function and forming-film effect, the doping proportion of the light-absorbing bodies 131 and the planarization layer 13 can be less than or equal to 35:100. In other words, the doping proportion of the light-absorbing bodies 131 and the dried mixed solution (the planarization layer 13) can be less than or equal to 35:100. For making sure the light-absorbing bodies 131 with good light-absorbing performance, the doping proportion of the light-absorbing bodies 131 and the dried mixed solution (the planarization layer 13) can be greater than or equal to 1:10.

Material of the light-absorbing bodies 131 is one or at least two selected from a group consisting of carbon nanotube, nickel-iron alloy, and benzothiophene chemicals. Therefore, the material of the light-absorbing bodies 131 can be carbon nanotube, nickel-iron alloy, and benzothiophene chemicals. Further, the light-absorbing bodies 131 can include two materials doped in the planarization layer 13 or three materials doped in the planarization layer 13.

The particle size of the light-absorbing bodies 131 is less than a thickness of the planarization layer 13. This arrangement is good for forming a film of the planarization layer 13. Furthermore, the particle size of the light-absorbing bodies 131 is less than one third thickness of the planarization layer 13. The planarization layer 13 is functioned on the top surface of the TFT array function layer 12 to form an anode electrode 14. Therefore, the planarization layer 13 shall have a certain levelling property. Thus, when the particle size of the light-absorbing bodies 131 is less than one third thickness of the planarization layer 13, the planarization layer 13 has better performance.

At another aspect, the light-absorbing bodies 131 are uniformly distributed in the planarization layer 13. This arrangement is good for forming a film of the planarization layer 13 and also improves the light-absorbing performance of the light-absorbing bodies 131 in the planarization layer 13. In the OLED display panel of the present invention, the TFT array function layer 12 comprises an active layer 121, a first insulating layer 122, a first gate metal layer 123, a second insulating layer 124, a second gate metal layer 125, an interlayer dielectric layer 126, and a source/drain metal layer 127 on the substrate in sequence.

Figure 2:
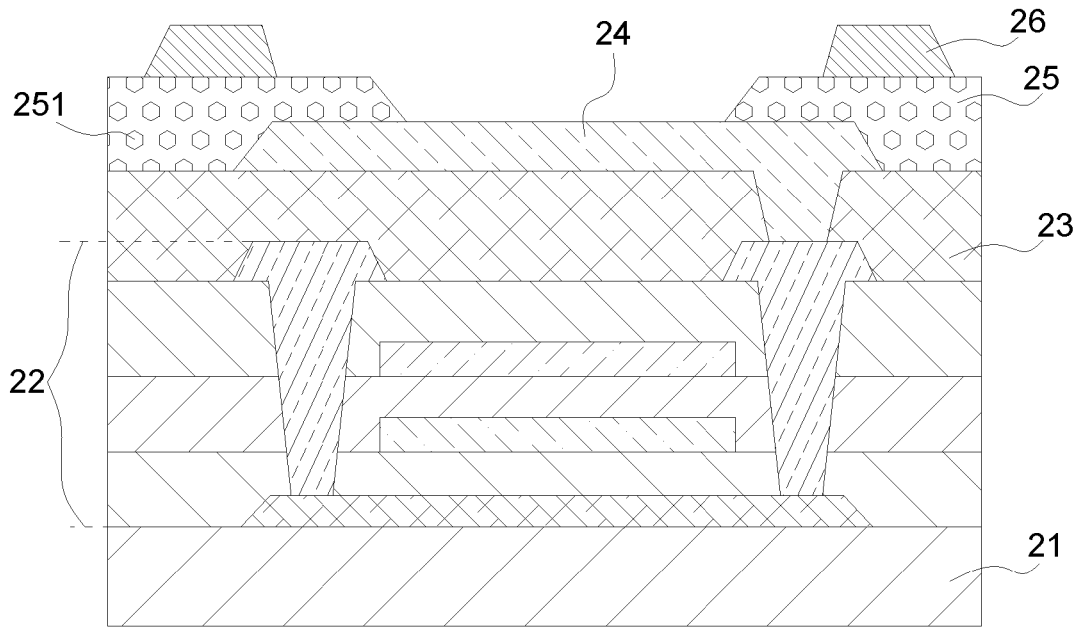
FIG. 2 is a schematic structural diagram of an OLED display panel according to a second embodiment of the present invention.

Referring to FIG. 2, the OLED display panel 200 according to a second embodiment of the present invention includes a substrate 21, a thin film transistor array function layer 22, a planarization layer 23, an anode electrode 24, a pixel definition layer 25, and a spacer 26. The difference between the first embodiment and the second embodiment is the pixel definition layer 25 including the light-absorbing bodies 251 for absorbing the incident light emitted from outside the OLED display. The light-absorbing bodies 251 are doped in the pixel definition layer 25.

In the second embodiment, when the outer light emits downward through the organic light emitting layer, light-absorbing bodies 251 doped in the pixel definition layer 25 absorbs most part of light and only little part of light can transmit to the first gate electrode metal layer and the second gate electrode metal layer or other layers in the TFT array function layer 22. Therefore, only very minimum light is reflected, which can result in clear image and better performance and lower visual interference with OLED panels.

Regarding the forming processes of the pixel definition layer 25, at the beginning, prepare materials for the pixel definition layer 25. Material of the pixel definition layer 25 is a solution with high-concentration. Then, mix up the light-absorbing bodies 131 in the material of pixel definition layer 25 and mix it in a uniform way to form a mixed solution. Then, coat the mixed solution on the anode electrode 24. Finally, dry the mixed solution to form the pixel definition layer 25.

For making sure the pixel definition layer 25 with good forming-film effect, the doping proportion of the light-absorbing bodies 251 and the pixel definition layer 25 can be less than or equal to 35:100. In other words, the doping proportion of the light-absorbing bodies 251 and the dried mixed solution (the pixel definition layer 25) can be less than or equal to 35:100. For making sure the light-absorbing bodies 251 with good light-absorbing performance, the doping proportion of the light-absorbing bodies 251 and the dried mixed solution (the pixel definition layer 25) can be greater than or equal to 1:10.

The particle size of the light-absorbing bodies 251 is less than a thickness of the pixel definition layer 25. This arrangement is good for forming a film of the pixel definition layer 25. The light-absorbing bodies 251 are uniformly distributed in the pixel definition layer 25. This arrangement improves the light-absorbing performance of the light-absorbing bodies 251.

Figure 3:
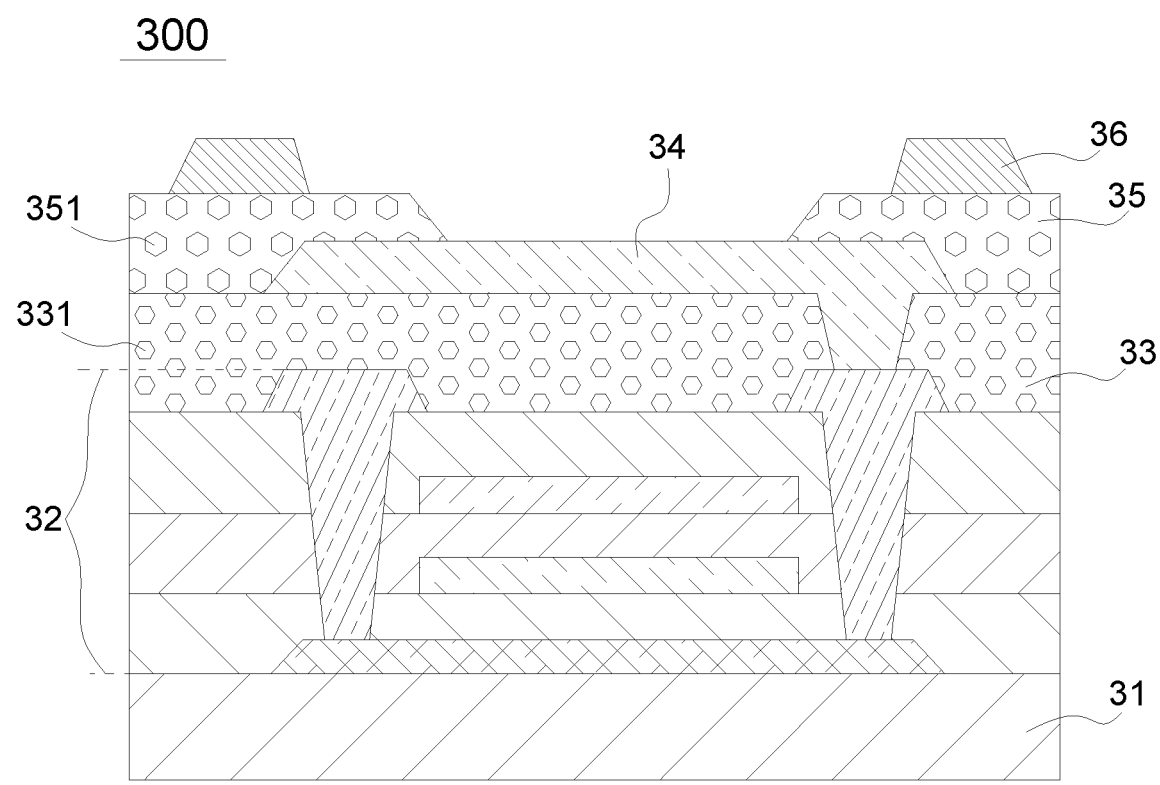
FIG. 3 is a schematic structural diagram of an OLED display panel according to a third embodiment of the present invention.

Referring to FIG. 3, an OLED display panel 300 of the third embodiment includes a substrate 31, a TFT array function layer 32, a planarization layer 33, an anode electrode 34, a pixel definition layer 35, and a spacer 36. The difference between the third embodiment and the first embodiment is the planarization layer 33 the pixel definition layer 35 including the light-absorbing bodies for absorbing the incident light emitted from outside the OLED display. The light-absorbing bodies are doped in the planarization layer 33 and in the pixel definition layer 35. The light-absorbing bodies doped in the planarization layer 33 are the first light-absorbing bodies 331. The light-absorbing bodies doped in the pixel definition layer 35 are the second light-absorbing bodies 351. In third embodiment, the present invention dopes the light-absorbing bodies both in the planarization layer 33 and in the pixel definition layer 35 to improve the light-absorbing performance. The first light-absorbing bodies 331 doped in the planarization layer 33 and the light-absorbing bodies of the first embodiment are the same. More details can be referenced by the first embodiment. The second light-absorbing bodies 351 doped in the pixel definition layer 35 and the light-absorbing bodies of the second embodiment are the same. More details can be referenced by the second embodiment.

An embodiment of the present invention provides an organic light emitting diode (OLED) device and the OLED device includes a display panel, including: a substrate; a thin film transistor array function layer disposed on the substrate; a planarization layer disposed on the thin film transistor array function layer; an anode electrode disposed on the planarization layer; and a pixel definition layer disposed on the anode electrode. The planarization layer and/or the pixel definition layer include a plurality of light-absorbing bodies used for absorbing incident light emitted from outside the OLED display panel. The light-absorbing bodies are doped in the planarization layer and/or the pixel definition layer.

In the OLED display panel of the present invention, when the planarization layer is doped with the light-absorbing bodies, a particle size of the light-absorbing bodies is less than a thickness of the planarization layer; when the pixel definition layer is doped with the light-absorbing bodies, the particle size of the light-absorbing bodies is less than a thickness of the pixel definition layer.

In the OLED display panel of the present invention, when the planarization layer is doped with the light-absorbing bodies, the particle size of the light-absorbing bodies is less than or equal to one third thickness of the planarization layer.

In the OLED display panel of the present invention, the light-absorbing bodies are distributed uniformly in the planarization layer and/or the pixel definition layer.

In the OLED display panel of the present invention, when the planarization layer is doped with the light-absorbing bodies, a doping ratio of the light-absorbing bodies and the planarization layer is less than or equal to 35 to 100; when the pixel definition layer is doped with the light-absorbing bodies, a doping ratio of the light-absorbing bodies and the pixel definition layer is less than or equal to 35 to 100.

In the OLED display panel of the present invention, a material of the light-absorbing bodies is one or at least two selected from a group consisting of carbon nanotube, nickel-iron alloy, and benzothiophene chemicals.

In the OLED display panel of the present invention, the thin film transistor array function layer includes an active layer, a first insulating layer, a first gate metal layer, a second insulating layer, a second gate metal layer, an interlayer dielectric layer, and a source/drain metal layer on the substrate in sequence.

Comparing to conventional display panels, the OLED display panel and OLED display device according to the present invention utilize the light-absorbing bodies doped in the planarization layer and/or the pixel definition layer to absorb incident light emitted from outside the OLED display panel and to eliminate outer light reflected from the array function layer inside the OLED display panel and also lower the influence on the light-emitting layer from the reflected light. Therefore, only very minimum light is reflected, which can solve the problems occurred from conventional display panels. For example, outer light is reflected from the gate electrode layer and source/drain metal layer and can result in light interference between the reflected light and light emitted from the organic light-emitting layer. Therefore, the present invention can result in clear image and better performance and lower visual interference with OLED panels can effectively solve those issues occurred from conventional display panels.

The present invention has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:
1. An organic light emitting diode (OLED) display panel, comprising:
   a substrate;
   a thin film transistor array function layer disposed on the substrate;
   a planarization layer disposed on the thin film transistor array function layer;
   an anode electrode disposed on the planarization layer; and
   a pixel definition layer disposed on the anode electrode,
   wherein at least one of the planarization layer and the pixel definition layer comprise a plurality of light-absorbing bodies used for absorbing incident light emitted from outside the OLED display panel, the light-absorbing bodies are doped in the at least one of the planarization layer and the pixel definition layer;
   a material of the light-absorbing bodies is one or at least two selected from a group consisting of carbon nanotube, nickel-iron alloy, and benzothiophene chemicals; and
   when the planarization layer is doped with the light-absorbing bodies, a particle size of the light-absorbing bodies is less than a thickness of the planarization layer; when the pixel definition layer is doped with the light-absorbing bodies, the particle size of the light-absorbing bodies is less than a thickness of the pixel definition layer.

2. The OLED display panel as claimed in claim 1, wherein when the planarization layer is doped with the light-absorbing bodies, the particle size of the light-absorbing bodies is less than or equal to one third thickness of the planarization layer.

3. The OLED display panel as claimed in claim 1, wherein the light-absorbing bodies are distributed uniformly in the at least one of the planarization layer and the pixel definition layer.

4. The OLED display panel as claimed in claim 1, wherein when the planarization layer is doped with the light-absorbing bodies, a doping ratio of the light-absorbing bodies and the planarization layer is less than or equal to 35 to 100; when the pixel definition layer is doped with the light-absorbing bodies, a doping ratio of the light-absorbing bodies and the pixel definition layer is less than or equal to 35 to 100.

5. The OLED display panel as claimed in claim 1, wherein the thin film transistor array function layer comprises an active layer, a first insulating layer, a first gate metal layer, a second insulating layer, a second gate metal layer, an interlayer dielectric layer, and a source/drain metal layer on the substrate in sequence.

6. An organic light emitting diode (OLED) display panel, comprising:
   a substrate;
   a thin film transistor array function layer disposed on the substrate;
   a planarization layer disposed on the thin film transistor array function layer;
   an anode electrode disposed on the planarization layer; and
   a pixel definition layer disposed on the anode electrode,
   wherein at least one of the planarization layer and the pixel definition layer comprise a plurality of light-absorbing bodies used for absorbing incident light emitted from outside the OLED display panel, the light-absorbing bodies are doped in the at least one of the planarization layer and the pixel definition layer,
   wherein a material of the light-absorbing bodies is one or at least two selected from a group consisting of carbon nanotube, nickel-iron alloy, and benzothiophene chemicals.

7. The OLED display panel as claimed in claim 6, wherein when the planarization layer is doped with the light-absorbing bodies, a particle size of the light-absorbing bodies is less than a thickness of the planarization layer; when the pixel definition layer is doped with the light-absorbing bodies, the particle size of the light-absorbing bodies is less than a thickness of the pixel definition layer.

8. The OLED display panel as claimed in claim 7, wherein when the planarization layer is doped with the light-absorbing bodies, the particle size of the light-absorbing bodies is less than one third thickness of the planarization layer.

9. The OLED display panel as claimed in claim 6, wherein the light-absorbing bodies are distributed uniformly in the at least one of the planarization layer and the pixel definition layer.

10. The OLED display panel as claimed in claim 6, wherein when the planarization layer is doped with the light-absorbing bodies, a doping ratio of the light-absorbing bodies and the planarization layer is less than or equal to 35 to 100; when the pixel definition layer is doped with the light-absorbing bodies, a doping ratio of the light-absorbing bodies and the pixel definition layer is less than or equal to 35 to 100.

11. The OLED display panel as claimed in claim 6, wherein the thin film transistor array function layer comprises an active layer, a first insulating layer, a first gate metal layer, a second insulating layer, a second gate metal layer, an interlayer dielectric layer, and a source/drain metal layer on the substrate in sequence.

12. An organic light emitting diode (OLED) display device, comprising an OLED display panel and the OLED display panel comprising:
   a substrate;
   a thin film transistor array function layer disposed on the substrate;
   a planarization layer disposed on the thin film transistor array function layer;
   an anode electrode disposed on the planarization layer; and
   a pixel definition layer disposed on the anode electrode,
   wherein at least one of the planarization layer and the pixel definition layer comprise a plurality of light-absorbing bodies used for absorbing incident light emitted from outside the OLED display panel, the light-absorbing bodies are doped in the at least one of the planarization layer and the pixel definition layer,
   wherein a material of the light-absorbing bodies is one or at least two selected from a group consisting of carbon nanotube, nickel-iron alloy, and benzothiophene chemicals.

13. The OLED display device as claimed in claim 12, wherein when the planarization layer is doped with the light-absorbing bodies, a particle size of the light-absorbing bodies is less than a thickness of the planarization layer; when the pixel definition layer is doped with the light-absorbing bodies, the particle size of the light-absorbing bodies is less than a thickness of the pixel definition layer.

14. The OLED display device as claimed in claim 13, wherein when the planarization layer is doped with the light-absorbing bodies, the particle size of the light-absorbing bodies is less than one third thickness of the planarization layer.

15. The OLED display device as claimed in claim 12, wherein when the planarization layer is doped with the light-absorbing bodies, a doping ratio of the light-absorbing bodies and the planarization layer is less than or equal to 35 to 100; when the pixel definition layer is doped with the light-absorbing bodies, a doping ratio of the light-absorbing bodies and the pixel definition layer is less than or equal to 35 to 100.

16. The OLED display device as claimed in claim 12, wherein the light-absorbing bodies are distributed uniformly in the at least one of the planarization layer and the pixel definition layer.

17. The OLED display device as claimed in claim 12, wherein the thin film transistor array function layer comprises an active layer, a first insulating layer, a first gate metal layer, a second insulating layer, a second gate metal layer, an interlayer dielectric layer, and a source/drain metal layer on the substrate in sequence.

\* \* \* \* \*